(12) United States Patent
Kobayashi et al.

(10) Patent No.: US 10,672,837 B2
(45) Date of Patent: Jun. 2, 2020

(54) IMAGING ELEMENT, METHOD OF MANUFACTURING IMAGING ELEMENT, AND IMAGING DEVICE

(71) Applicant: SONY CORPORATION, Tokyo (JP)

(72) Inventors: Hajime Kobayashi, Kanagawa (JP); Yuichi Tokita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/302,743

(22) PCT Filed: May 16, 2017

(86) PCT No.: PCT/JP2017/018343
§ 371 (c)(1),
(2) Date: Nov. 19, 2018

(87) PCT Pub. No.: WO2017/208806
PCT Pub. Date: Dec. 7, 2017

(65) Prior Publication Data
US 2019/0296086 A1    Sep. 26, 2019

(30) Foreign Application Priority Data

Jun. 2, 2016 (JP) .................................. 2016-111096

(51) Int. Cl.
*H01L 27/30* (2006.01)
*H01L 51/00* (2006.01)
(Continued)

(52) U.S. Cl.
CPC ........ *H01L 27/307* (2013.01); *H01L 21/3205* (2013.01); *H01L 21/768* (2013.01);
(Continued)

(58) Field of Classification Search
CPC ................ H01L 27/307; H01L 51/4253–4273
See application file for complete search history.

(56) References Cited

U.S. PATENT DOCUMENTS

2009/0189058 A1* 7/2009 Mitsui .................... B82Y 10/00
250/208.1
2012/0025179 A1 2/2012 Mitsui et al.
(Continued)

FOREIGN PATENT DOCUMENTS

| CN | 106233466 A | 12/2016 |
|---|---|---|
| JP | 2009-200482 A | 9/2009 |

(Continued)

OTHER PUBLICATIONS

International Search Report and Written Opinion of PCT Application No. PCT/JP2017/018343, dated Jun. 27, 2017, 2 pages of ISR translation, 9 pages of ISRWO.

*Primary Examiner* — Daniel P Shook
(74) *Attorney, Agent, or Firm* — Chip Law Group

(57) ABSTRACT

An imaging element according to an embodiment of the present disclosure includes: a first electrode and a second electrode facing each other; and a photoelectric conversion layer including a p-type semiconductor and an n-type semiconductor, and provided between the first electrode and the second electrode, in which the photoelectric conversion layer has an exciton charge separation rate of $1\times10^{10}$ s$^{-1}$ to $1\times10^{16}$ s$^{-1}$ both inclusive in a p-n junction surface formed by the p-type semiconductor and the n-type semiconductor.

18 Claims, 11 Drawing Sheets

(51) Int. Cl.
*H01L 51/42* (2006.01)
*H01L 27/28* (2006.01)
*H01L 23/522* (2006.01)
*H01L 27/146* (2006.01)
*H01L 21/768* (2006.01)
*H01L 31/10* (2006.01)
*H01L 21/3205* (2006.01)
*H04N 5/369* (2011.01)

(52) U.S. Cl.
CPC .......... *H01L 23/522* (2013.01); *H01L 27/146* (2013.01); *H01L 27/286* (2013.01); *H01L 31/10* (2013.01); *H01L 51/0026* (2013.01); *H01L 51/4253* (2013.01); *H04N 5/369* (2013.01); *H01L 51/0046* (2013.01); *H01L 51/0047* (2013.01); *H01L 51/0055* (2013.01); *H01L 51/0072* (2013.01); *H01L 51/0074* (2013.01); *H01L 51/0078* (2013.01)

(56) References Cited

U.S. PATENT DOCUMENTS

| 2014/0182674 A1* | 7/2014 | Higashi | H01L 51/445 |
| | | | 136/256 |
| 2017/0040550 A1 | 2/2017 | Yakushiji et al. | |
| 2017/0054089 A1* | 2/2017 | Obana | H01L 51/0072 |

FOREIGN PATENT DOCUMENTS

| JP | 2013-069663 A | 4/2013 |
| JP | 2015-233117 A | 12/2015 |
| JP | 2016-051693 A | 4/2016 |
| TW | 201607012 A | 2/2016 |
| WO | 2013/035283 A1 | 3/2013 |
| WO | 2015/163349 A1 | 10/2015 |
| WO | 2015/174010 A1 | 11/2015 |
| WO | 2016/031962 A1 | 3/2016 |

\* cited by examiner

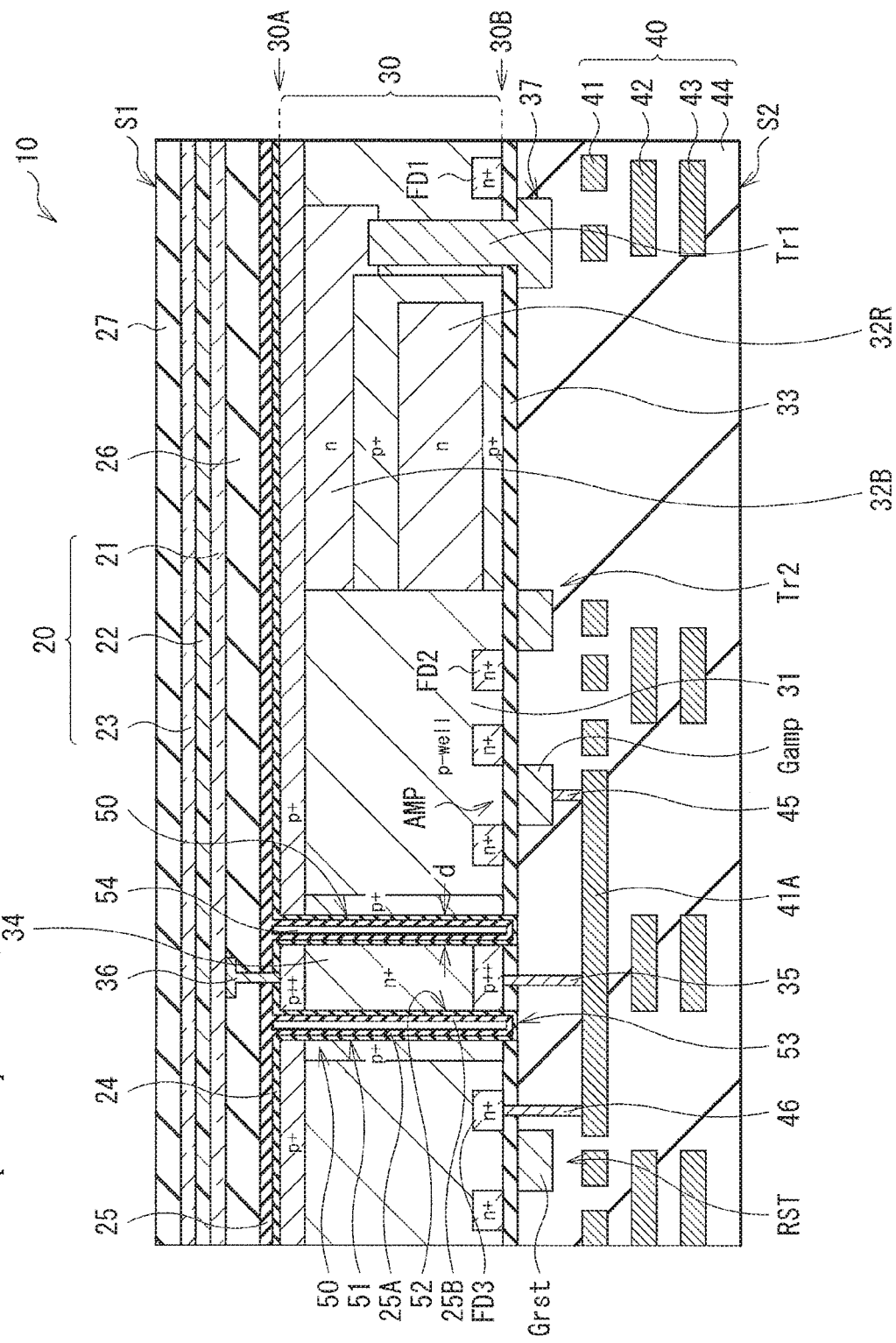
[FIG. 1]

[FIG. 2]
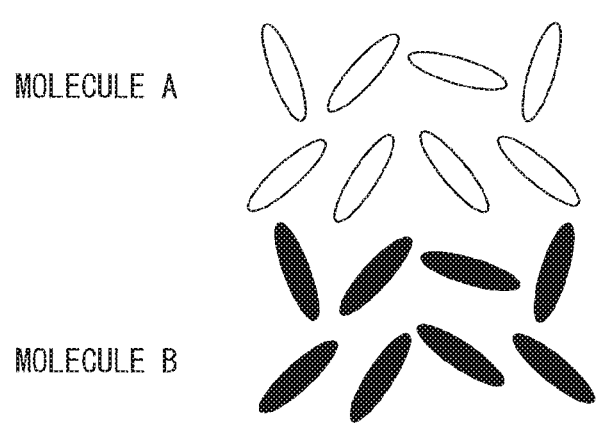
[FIG. 3]
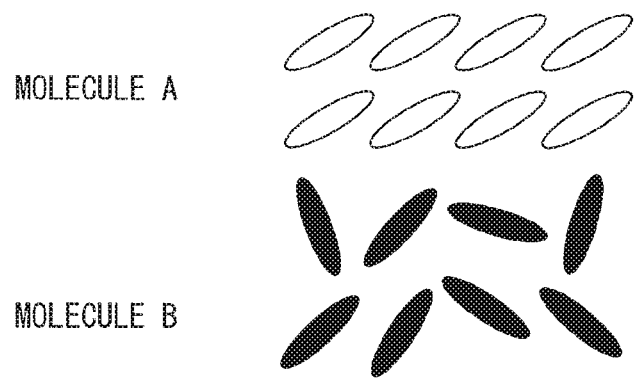

[ FIG. 4 ]
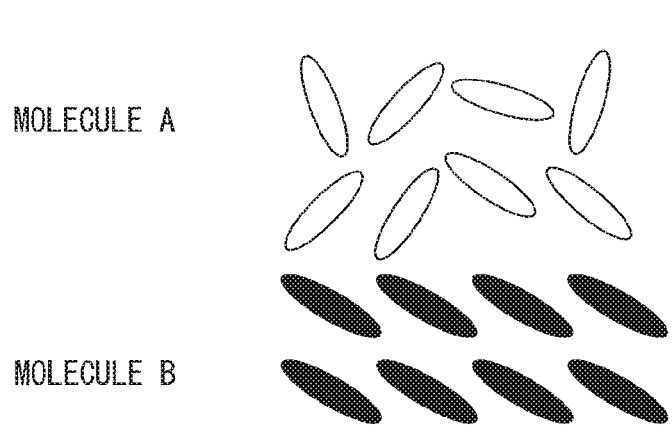
[ FIG. 5 ]
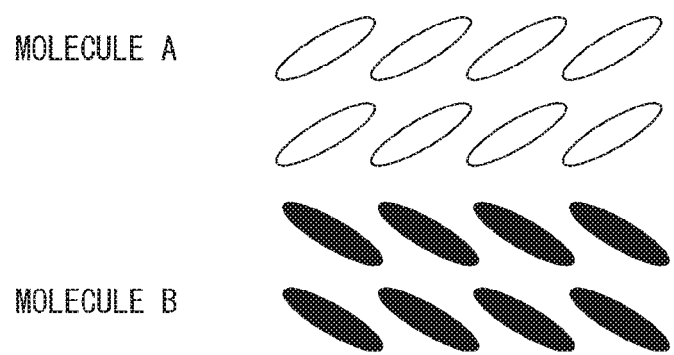

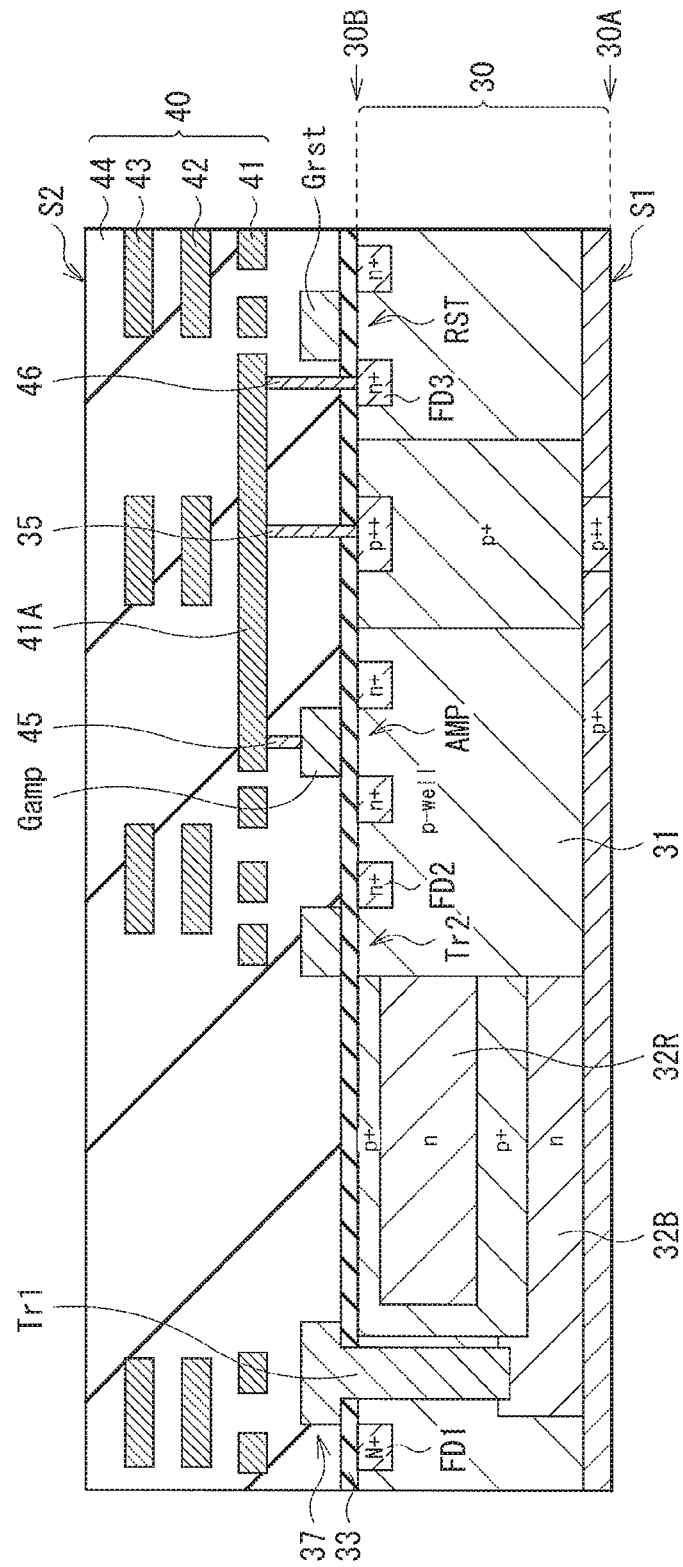
[FIG. 6]

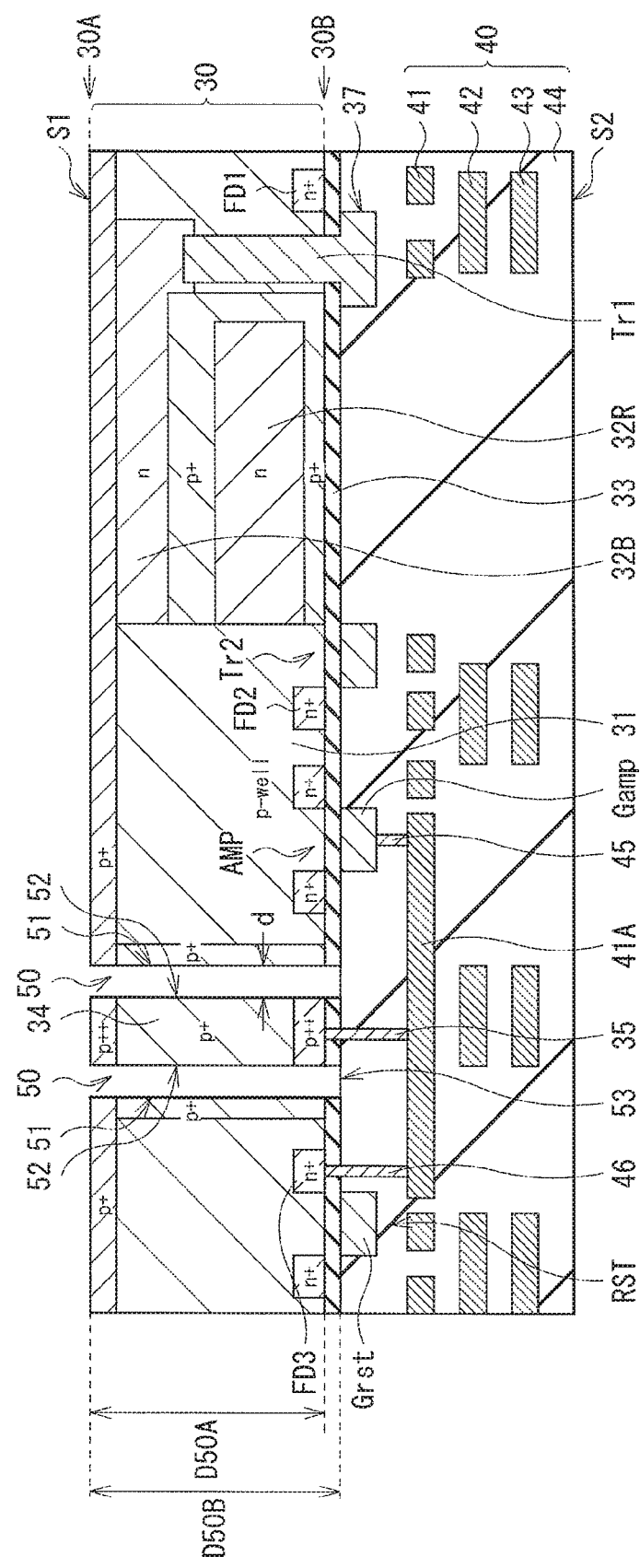
[FIG. 7]

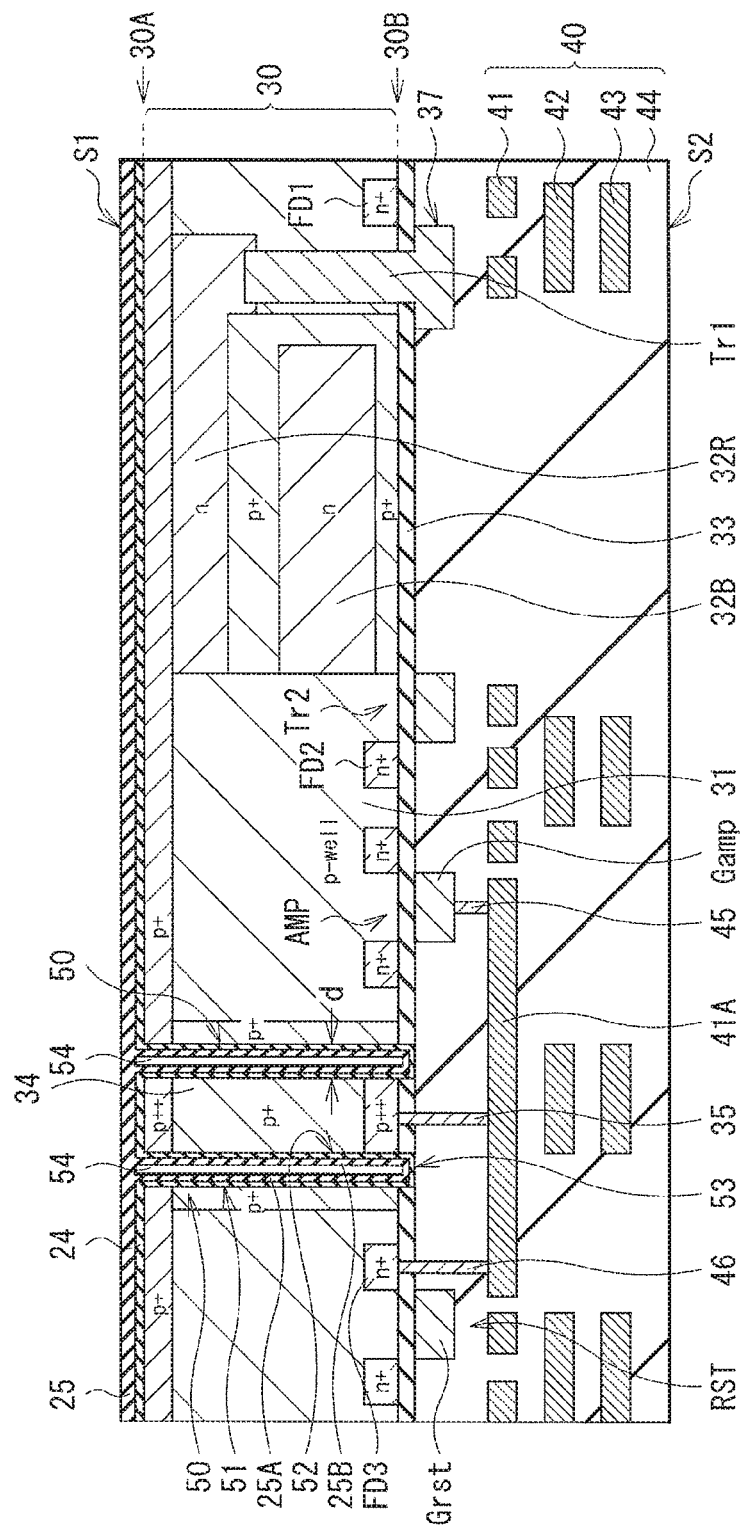
[FIG. 8]

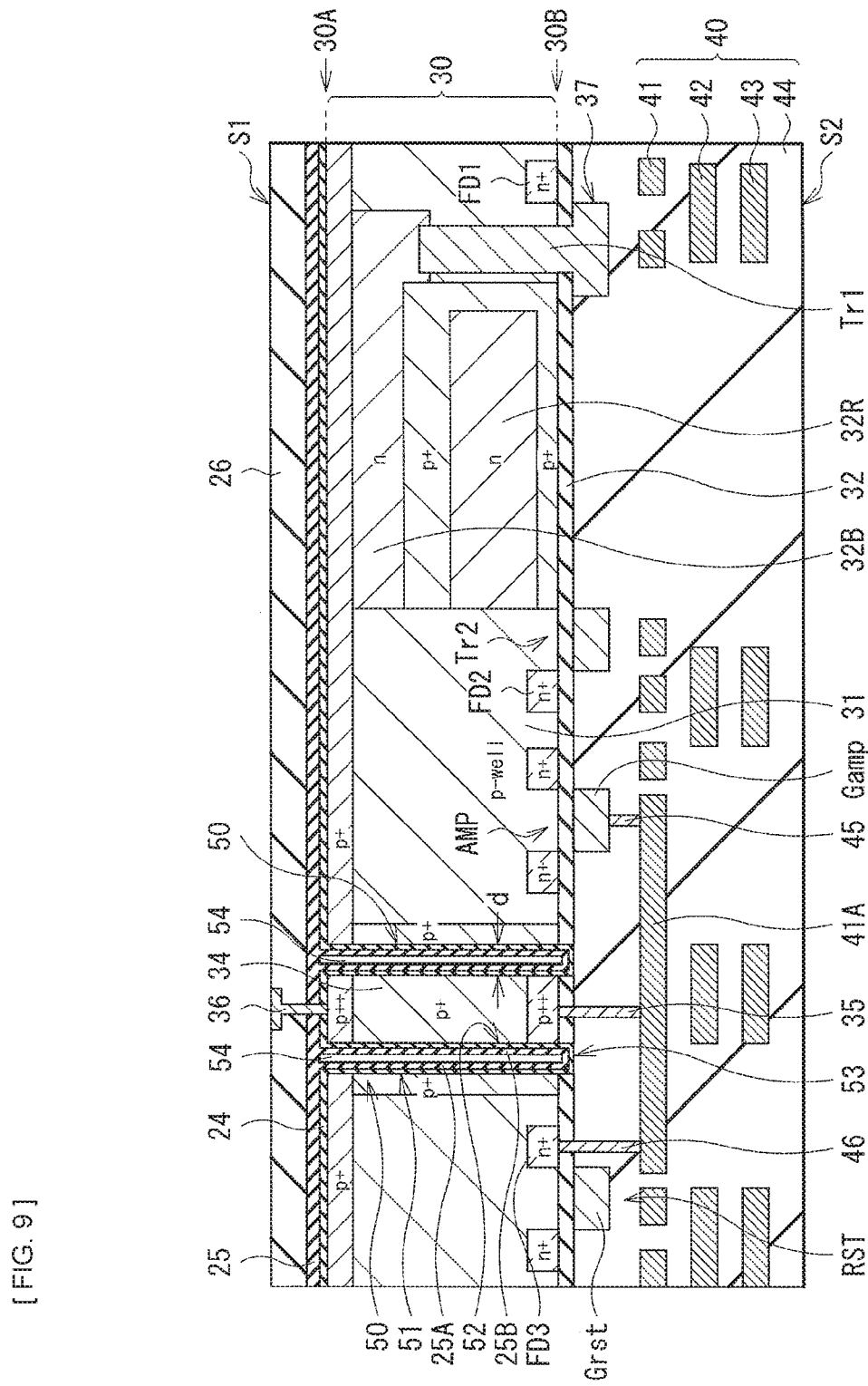
[FIG. 9]

[ FIG. 10 ]
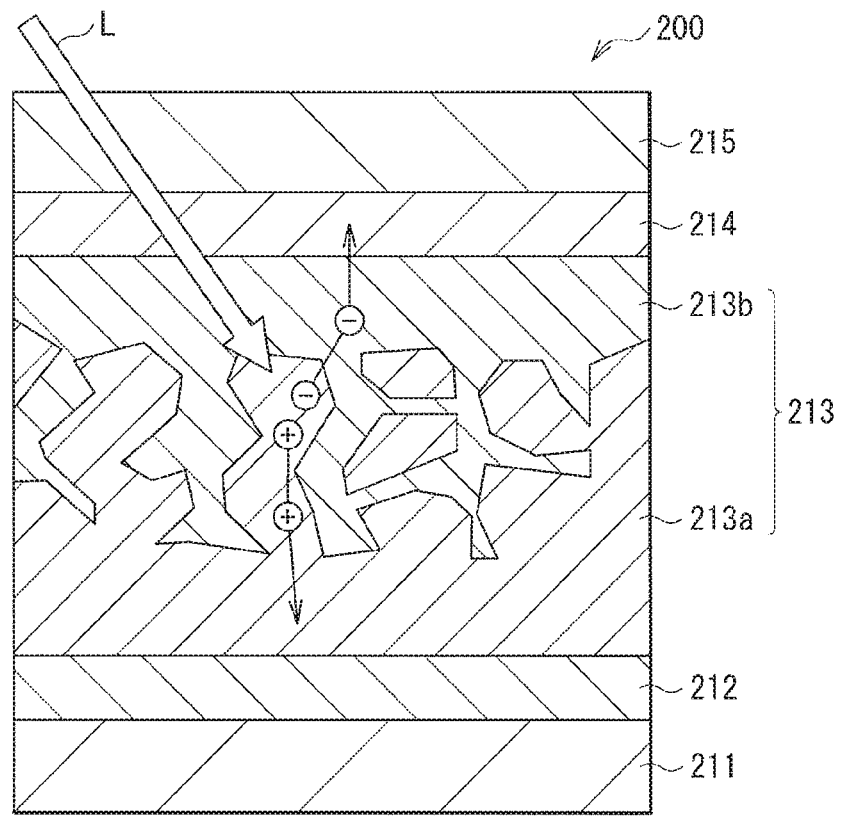
[ FIG. 11 ]
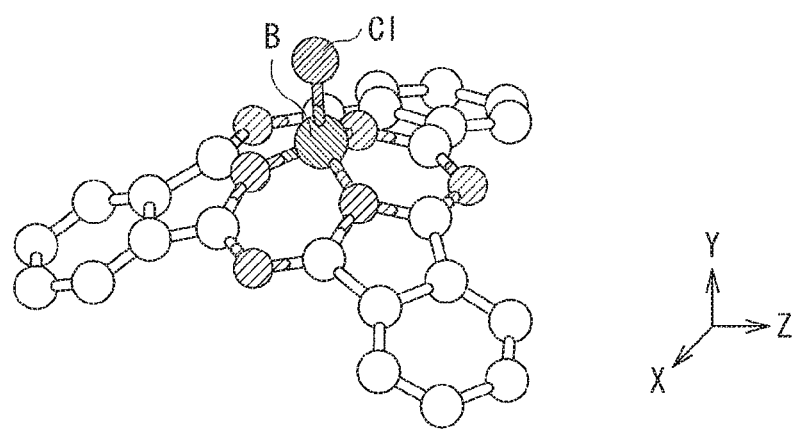

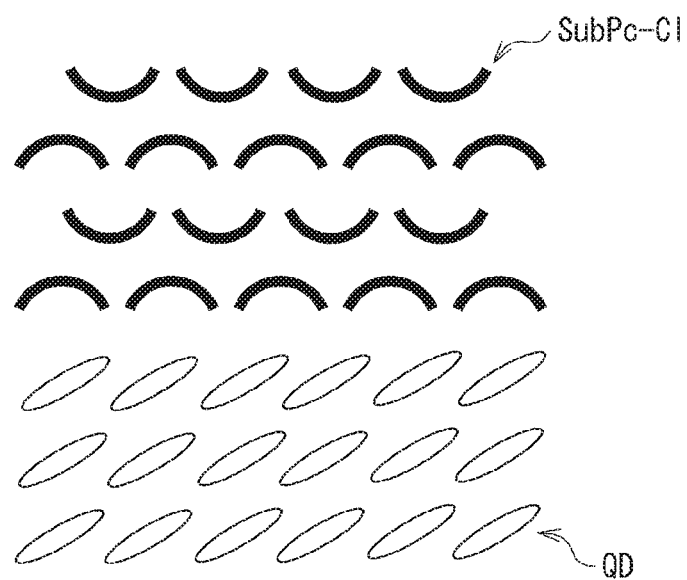
[FIG. 12A]
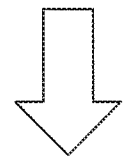
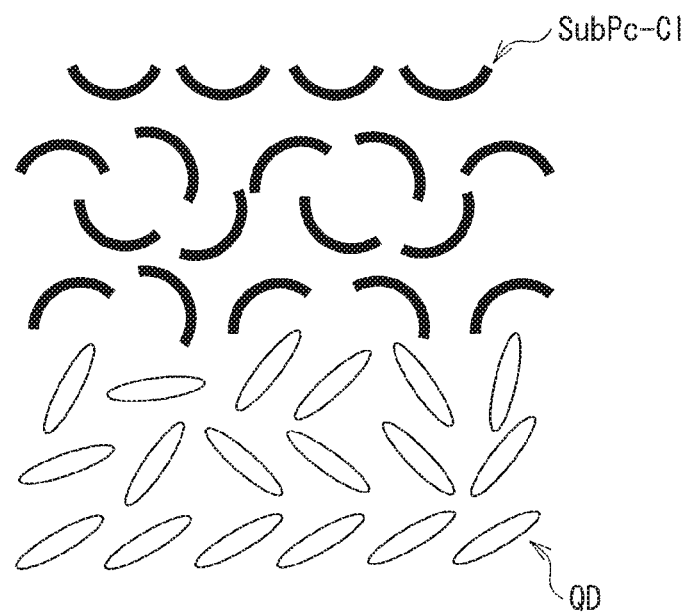
[FIG. 12B]

[ FIG. 13 ]
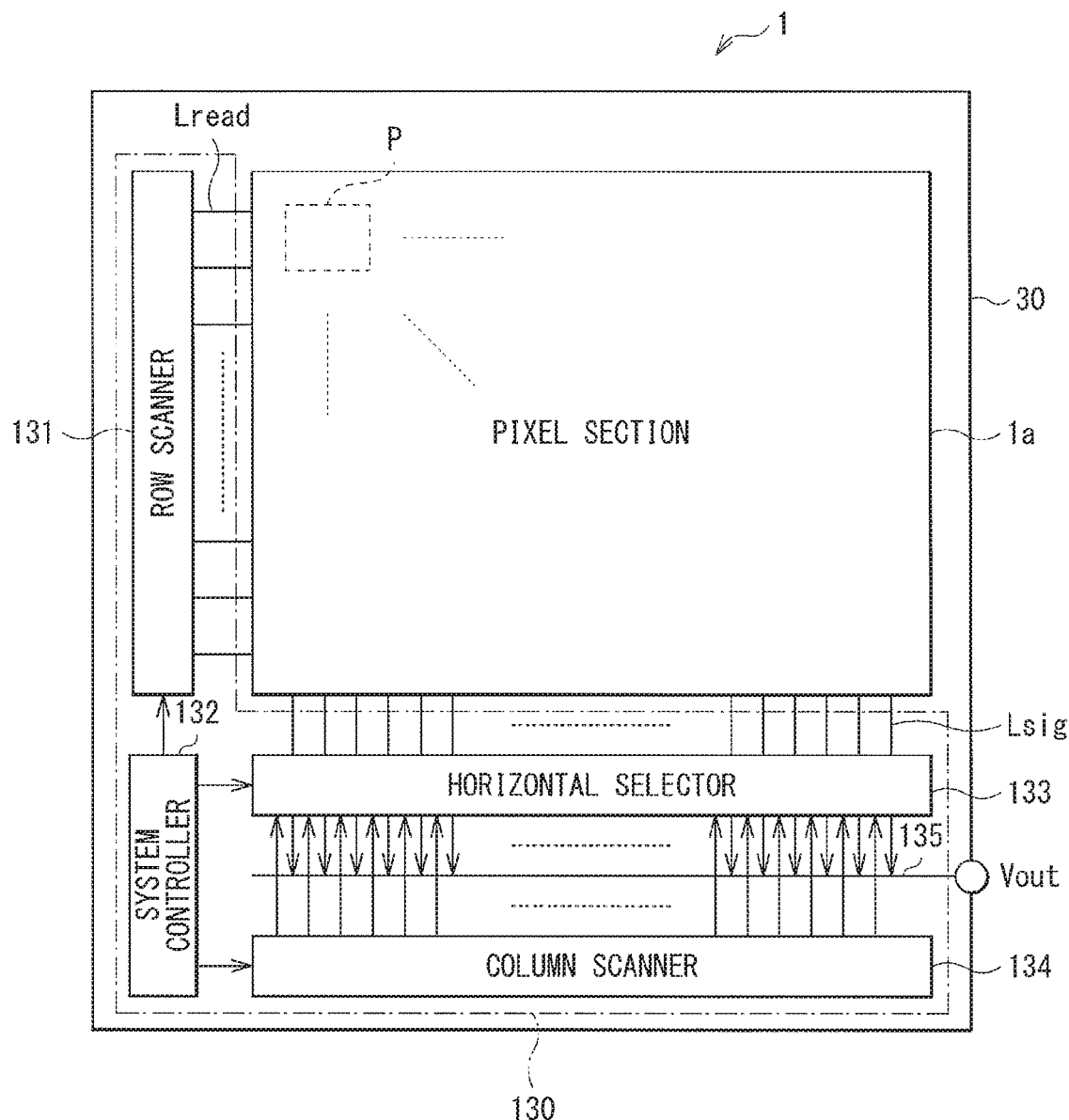

[FIG. 14]
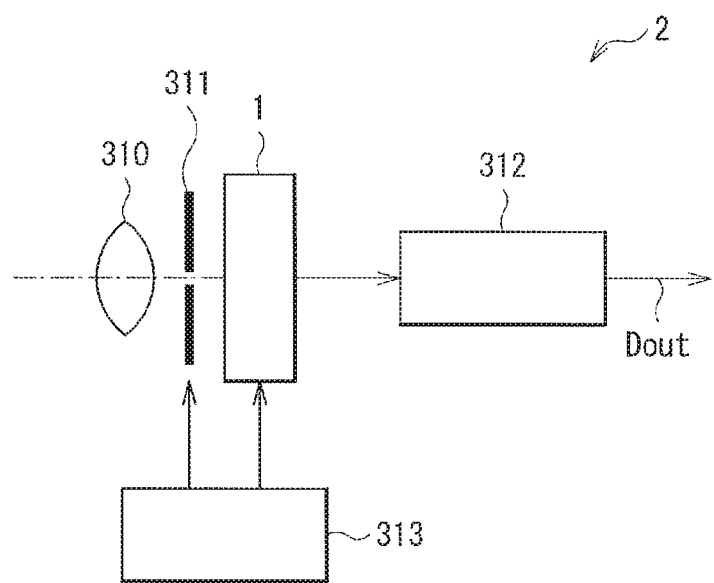

IMAGING ELEMENT, METHOD OF MANUFACTURING IMAGING ELEMENT, AND IMAGING DEVICE

CROSS REFERENCE TO RELATED APPLICATIONS

This application is a U.S. National Phase of International Patent Application No. PCT/JP2017/018343 filed on May 16, 2017, which claims priority benefit of Japanese Patent Application No. JP 2016-111096 filed in the Japan Patent Office on Jun. 2, 2016. Each of the above-referenced applications is hereby incorporated herein by reference in its entirety.

TECHNICAL FIELD

The present disclosure relates to an imaging element including a photoelectric conversion layer that has a bulk-hetero structure, a method of manufacturing the same, and an imaging device.

BACKGROUND ART

In recent years, a solid-state imaging device such as a CCD (Charge Coupled Device) image sensor or a CMOS (Complementary Metal Oxide Semiconductor) image sensor has used an imaging element that obtains signals of three colors to suppress deterioration in sensitivity. As such an imaging element, for example, PTL 1 discloses a color imaging element including a light reception unit including an organic semiconductor material and a light reception unit including silicon. The organic semiconductor material detects green light and silicon detects each of red light and blue light. The light reception unit that detects green light has a bulk-hetero structure in which a p-type semiconductor and an n-type semiconductor are randomly mixed.

This bulk-hetero structure is a p-n junction surface formed through mixing the p-type semiconductor and the n-type semiconductor, and an exciton charge separation rate in the p-n junction surface significantly influences sensitivity of the imaging element. Accordingly, NTLs 1 to 3 report a method of improving the exciton charge separation rate in the p-n junction surface.

CITATION LIST

Patent Literature

PTL 1: Japanese Unexamined Patent Application Publication No. 2003-332551

Non-Patent Literature

NPL 1: V. Lemaur et al., J. Am. Chem. Soc. 127, 6077 (2005)
NPL 2: A. Burquel et al., J. Phys. Chem. A 110, 3447 (2006)
NPL 3: P. Song et al., J. Phys. Chem. C 117, 15879 (2013)

SUMMARY OF THE INVENTION

Incidentally, in order to respond to a need for downsizing of the imaging device, a further improvement in sensitivity of the imaging element is desired.

It is desirable to provide an imaging element, a method of manufacturing an imaging element, and an imaging device that enable an improvement in sensitivity.

An imaging element according to an embodiment of the present disclosure includes: a first electrode and a second electrode facing each other; and a photoelectric conversion layer including a p-type semiconductor and an n-type semiconductor, and provided between the first electrode and the second electrode, in which the photoelectric conversion layer has an exciton charge separation rate of $1\times10^{10}$ s$^{-1}$ to $1\times10^{16}$ s$^{-1}$ both inclusive in a p-n junction surface formed by the p-type semiconductor and the n-type semiconductor.

A method of manufacturing an imaging element according to an embodiment of the present disclosure includes: forming a first electrode; forming a photoelectric conversion layer including a p-type semiconductor and an n-type semiconductor on the first electrode; and forming a second electrode on the photoelectric conversion layer, in which the photoelectric conversion layer has an exciton charge separation rate of $1\times10^{10}$ s$^{-1}$ to $1\times10^{16}$ s$^{-1}$ both inclusive in a p-n junction surface formed by the p-type semiconductor and the n-type semiconductor.

An imaging device according to an embodiment of the present disclosure includes one or a plurality of imaging elements according to the foregoing embodiment of the present disclosure for each of a plurality of pixels.

In the imaging element according to the embodiment of the present disclosure, the method of manufacturing the imaging element according to the embodiment of the present disclosure, and the imaging device according to the embodiment of the present disclosure, the photoelectric conversion layer having a p-n junction surface in which the exciton charge separation rate is from $1\times10^{10}$ s$^{-1}$ to $1\times10^{16}$ s$^{-1}$ both inclusive is provided, which makes it possible to improve photoelectric conversion efficiency.

According to the imaging element of the embodiment of the present disclosure, the method of manufacturing the imaging element of the embodiment of the present disclosure, and the imaging device of the embodiment of the present disclosure, the p-n junction surface formed in the photoelectric conversion layer has an exciton charge separation rate of $1\times10^{10}$ s$^{-1}$ to $1\times10^{16}$ s$^{-1}$ both inclusive, which makes it possible to improve photoelectric conversion efficiency and improve sensitivity.

It is to be noted that effects described here are not necessarily limited and any of effects described in the present disclosure may be included.

BRIEF DESCRIPTION OF THE DRAWINGS

FIG. 1 is a cross-sectional view of an example of a schematic configuration of an imaging element according to an embodiment of the present disclosure.

FIG. 2 is a schematic view of orientation of molecules in a typical photoelectric conversion layer.

FIG. 3 is a schematic view of an example of orientation of molecules in a photoelectric conversion layer of the present disclosure.

FIG. 4 is a schematic view of another example of orientation of molecules in the photoelectric conversion layer.

FIG. 5 is a schematic view of another example of orientation of molecules in the photoelectric conversion layer.

FIG. 6 is a cross-sectional view for description of a method of manufacturing the imaging element illustrated in FIG. 1.

FIG. 7 is a cross-sectional view of a process following FIG. 6.

FIG. 8 is a cross-sectional view of a process following FIG. 7.

FIG. 9 is a cross-sectional view of a process following FIG. 8.

FIG. 10 is a schematic view describing transfer of electric charges in a photoelectric conversion layer having a bulk-hetero structure.

FIG. 11 is a schematic view of a molecular structure of subphthalocyanine.

FIGS. 12A and 12B are schematic views describing a formation example of an interface structure by simulation.

FIG. 13 a functional block diagram of an imaging device using the imaging element illustrated in FIG. 1 as a pixel.

FIG. 14 is a block diagram illustrating a schematic configuration of an electronic apparatus using the imaging device illustrated in FIG. 13.

MODES FOR CARRYING OUT THE INVENTION

Some embodiments of the present disclosure are described in detail below with reference to the drawings. It is to be noted that description is given in the following order.
1. Embodiment (An Imaging Element Including a Photoelectric Conversion Layer in which Molecular Orientation is Controlled)
  1-1. Configuration of Imaging Element
  1-2. Method of Manufacturing Imaging Element
  1-3. Workings and Effects
2. Application Examples 1. Embodiment FIG. 1 illustrates a cross-sectional configuration of an imaging element (an imaging element 10) according to an embodiment of the present disclosure. The imaging element 10 configures, for example, one pixel (a unit pixel P) of an imaging device (an imaging device 1; refer to FIG. 13) such as a CMOS image sensor used for an electronic apparatus such as a digital still camera and a video camera.
(1-1. Configuration of Imaging Element)

The imaging element 10 is of, for example, a so-called longitudinal spectral type in which one organic photoelectric converter 20 and two inorganic photoelectric converters 32B and 32R are stacked in a longitudinal direction. The organic photoelectric converter 20 is provided on a side on which a first surface (a back surface) 30A is located of a semiconductor substrate 30. The inorganic photoelectric converters 32B and 32R are formed to be embedded in the semiconductor substrate 30, and are stacked in a thickness direction of the semiconductor substrate 30. The organic photoelectric converter 20 includes a p-type semiconductor and an n-type semiconductor, and includes a photoelectric conversion layer 22 that has a bulk-hetero junction structure in a layer. The bulk-hetero junction structure is a p-n junction surface formed through mixing a p-type semiconductor and an n-type semiconductor. In the present embodiment, the photoelectric conversion layer 22 is configured to have an exciton charge separation rate in the p-n junction surface of $1 \times 10^{10}$ s$^{-1}$ to $1 \times 10^{16}$ s$^{-1}$ both inclusive.

The organic photoelectric converter 20 and the inorganic photoelectric converters 32B and 32R selectively detect light of different wavelength ranges and perform photoelectric conversion. Specifically, the organic photoelectric converter 20 obtains a green (G) color signal. The inorganic photoelectric converters 32B and 32R respectively obtain a blue (B) color signal and a red (R) color signal by a difference in absorption coefficient. Hence, in the imaging element 10, a plurality of kinds of color signals are obtainable in one pixel without using a color filter.

It is to be noted that in the present embodiment, description is given of a case where electrons of electron-hole pairs generated by photoelectric conversion are read as signal electric charges (in a case where an n-type semiconductor region serves as a photoelectric conversion layer). Moreover, in the drawings, "+ (plus)" attached to "p" or "n" indicates that p-type or n-type impurity concentration is high, and "++" indicates that p-type or n-type impurity concentration is higher than that in a case of "+".

For example, floating diffusions (floating diffusion layers) FD1, FD2, and FD3, a vertical transistor (a transfer transistor) Tr1, a transfer transistor Tr2, an amplifier transistor (a modulator) AMP, a reset transistor RST, and a multilayer wiring line 40 are provided on a second surface (a front surface) 30B of the semiconductor substrate 30. The multilayer wiring line 40 has, for example, a configuration in which wiring layers 41, 42, and 43 are stacked in an insulating layer 44.

It is to be noted that in the drawings, a side on which the first surface 30A is located and a side on which the second surface 30B is located of the semiconductor substrate 30 are respectively represented as a light incident side S1 and a wiring layer side S2.

The organic photoelectric converter 20 has, for example, a configuration in which a lower electrode 21, a photoelectric conversion layer 22, and an upper electrode 23 are stacked in this order from the side on which the first surface 30A is located of the semiconductor substrate 30. The lower electrode 21 is formed separately for each imaging element 10, for example. The photoelectric conversion layer 22 and the upper electrode 23 are provided as common continuous layers for a plurality of imaging elements 10. For example, a layer having fixed electric charges (a fixed electric charge layer) 24, a dielectric layer 25 having insulation, and an interlayer insulating layer 26 are provided between the first surface 30A of the semiconductor substrate 30 and the lower electrode 21. A protective layer 27 is provided on the upper electrode 23. A planarization layer and an optical member such as an on-chip lens (both of which are not illustrated) are disposed above the protective layer 27.

A through electrode 34 is provided between the first surface 30A and the second surface 30B of the semiconductor substrate 30. The organic photoelectric converter 20 is coupled to a gate Gamp of the amplifier transistor AMP and the floating diffusion FD3 via the through electrode 34. Accordingly, in the imaging element 10, it is possible to favorably transfer electric charges generated in the organic photoelectric converter 20 on the side on which the first surface 30A is located of the semiconductor substrate 30 to the side on which the second surface 30B is located of the semiconductor substrate 30 via the through electrode 34, thereby enhancing characteristics.

The through electrode 34 is provided for each of the organic photoelectric converters 20 in the respective imaging elements 10, for example. The through electrode 34 has a function as a connector between the organic photoelectric converter 20 and both the gate Gamp of the amplifier transistor AMP and the floating diffusion FD3, and serves as a transmission path of electric charges (herein, electrons) generated in the organic photoelectric converter 20. A bottom end of the through electrode 34 is coupled to a connection unit 41A in the wiring layer 41 of the multilayer wiring line 40 via a first lower contact 35, for example. The connection unit 41A and the gate Gamp of the amplifier transistor AMP are coupled to each other by a second lower contact 45. The connection unit 41A and the floating diffusion FD3 are coupled to each other by a third lower contact 46. A top end of the through electrode 34 is coupled to the lower electrode 21 via an upper contact 36, for example.

A reset gate Grst of the reset transistor RST is preferably disposed adjacent to the floating diffusion FD3, as illustrated in FIG. 1. This makes it possible to reset electric charges accumulated in the floating diffusion FD3 by the reset transistor RST.

The through electrode 34 penetrates through the semiconductor substrate 30, and is separated from the semiconductor substrate 30 by a separation groove 50, for example. The through electrode 34 includes, for example, the same semiconductor as that of the semiconductor substrate 30, for example, silicon (Si), and preferably has a resistance value reduced through injecting an n-type or p-type impurity (for example, P+ in FIG. 1) into the semiconductor. Moreover, a high-concentration impurity region (for example, p++ in FIG. 1) is preferably provided in a top end section and a bottom end section of the through electrode 34 to further reduce connection resistance with the upper contact 36 and connection resistance with the first lower contact 35. The through electrode 34 may include a metal or a conductive material. Using the metal or the conductive material makes it possible to further reduce the resistance value of the through electrode 34 and connection resistance between the through electrode 34 and each of the first lower contact 35, the second lower contact 45 and the third lower contact 46. The metal or the conductive material included in the through electrode 34 is aluminum (Al), tungsten (W), titanium (Ti), cobalt (Co), hafnium (Hf), tantalum (Ta), etc.

An outer surface 51, an inner surface 52, and a bottom surface 53 of the separation groove 50 are covered with, for example, a dielectric layer 25 having insulation, as illustrated in FIG. 1. The dielectric layer 25 includes, for example, an outer dielectric layer 25A with which the outer surface 51 of the separation groove 50 is covered and an inner dielectric layer 25B with which the inner surface 52 of the separation groove 50 is covered. A cavity 54 is preferably provided between the outer dielectric layer 25A and the inner dielectric layer 25B. In other words, the separation groove 50 has a ring shape or a circular shape, and the cavity 54 has a ring shape or a circular shape concentric with the separation groove 50. This makes it possible to reduce a capacitance generated between the through electrode 34 and the semiconductor substrate 30 to enhance conversion efficiency and suppress delay (afterimages).

Moreover, an impurity region (P+ in FIG. 1) of the same conductive type (n-type or p-type) as that of the through electrode 34 is preferably provided on the outer surface 51 of the separation groove 50 in the semiconductor substrate 30. Further, the fixed electric charge layer 24 is preferably provided on the outer surface 51, the inner surface 52, and the bottom surface 53 of the separation groove 50 and the first surface 30A of the semiconductor substrate 30. Specifically, for example, it is preferable to provide a p-type impurity region (p+ in FIG. 1) on the outer surface 51 of the separation groove 50 in the semiconductor substrate 30 and provide a film having negative fixed electric charges as the fixed electric charge layer 24. This makes it possible to reduce a dark current.

In the imaging element 10 according to the present embodiment, light having entered the organic photoelectric converter 20 from a side on which the upper electrode 23 is located is absorbed by an electron acceptor or an electron donor in a bulk-hetero junction interface of the photoelectric conversion layer 22. Excitons thereby generated are transferred to an interface between the electron donor and the electron acceptor to be dissociated into electrons and holes. Electric charges (electrons and holes) generated here are carried to respective different electrodes by diffusion caused by a difference in concentration of carriers or by an inner electric field caused by a difference in work function between an anode (herein, the lower electrode 21) and a cathode (herein, the upper electrode 23), and are detected as photocurrents. Moreover, applying a potential between the lower electrode 21 and the upper electrode 23 makes it possible to control transport directions of electrons and holes.

Configurations, materials, etc. of respective components are described below.

The organic photoelectric converter 20 is an organic imaging element that absorbs green light corresponding to a portion or the entirety of a selective wavelength range (for example, from 495 nm to 570 nm) to generate electron-hole pairs.

The lower electrode 21 is provided in a region that is opposed to light reception surfaces of the inorganic photoelectric converters 32B and 32R formed in the semiconductor substrate 30 to cover these light reception surfaces. The lower electrode 21 includes a conductive film having light transparency, and includes, for example, ITO (indium tin oxide). Note that as the material of the lower electrode 21, a tin oxide ($SnO_2$)-based material doped with a dopant or a zinc oxide-based material prepared by doping aluminum zinc oxide (ZnO) with a dopant may be used in addition to ITO. Examples of the zinc oxide-based material include aluminum zinc oxide (AZO) doped with aluminum (Al) as a dopant, gallium zinc oxide (GZO) doped with gallium (Ga), and indium zinc oxide (IZO) doped with indium (In). Moreover, other than these materials, CuI, $InSbO_4$, ZnMgO, $CuInO_2$, $MgIN_2O_4$, CdO, $ZnSnO_3$, etc. may be used.

The photoelectric conversion layer 22 converts optical energy into electric energy. The photoelectric conversion layer 22 includes an organic semiconductor material serving as a p-type semiconductor or an n-type semiconductor. The photoelectric conversion layer 22 has a junction surface (a p-n junction surface) between the p-type semiconductor and the n-type semiconductor in a layer. The p-type semiconductor relatively serves as an electron donor (a donor), and the n-type semiconductor relatively serves as an electron acceptor (an acceptor). The photoelectric conversion layer 22 provides a place where excitons generated in absorption of light are separated into electrons and holes, and specifically separates excitons into electrons and holes in an interface (the p-n junction surface) between the electron donor and the electron acceptor.

The photoelectric conversion layer 22 according to the present embodiment has a configuration in which orientation of molecules in one or both of the p-type semiconductor and the n-type semiconductor is controlled. FIGS. 2 to 5 schematically illustrate orientation of molecules in the p-type semiconductor (molecules A) and the n-type semiconductor (molecules B) in the photoelectric conversion layer. In a photoelectric conversion layer in a typical imaging element, both a plurality of molecules A and a plurality of molecules B included in a layer are randomly oriented, as illustrated in FIG. 2. In contrast, in the photoelectric conversion layer 22 according to the present embodiment, for example, orientation of the plurality of molecules A included in a layer is controlled to orient the molecules in one direction, as illustrated in FIG. 3. Moreover, molecules of which orientation is controlled in the photoelectric conversion layer 22 may be the molecules B as illustrated in FIG. 4. Moreover, in the photoelectric conversion layer 22, it is desirable to control orientation of both the molecules A and the molecules B, as illustrated in FIG. 5. Accordingly, efficiency (an exciton charge separation rate) of separating excitons into electrons and holes in the p-n junction surface in the photoelectric conversion layer 22 is improved. Specifically, the photoelectric conversion layer 22 according to the present embodiment has, for example, an exciton charge separation rate of $1 \times 10^{10}$ s$^{-1}$ or more in the p-n junction surface. An upper limit of the exciton charge separation rate does not particularly matter, but is, for example, $1 \times 10^{16}$ s$^{-1}$ or less.

Examples of the organic semiconductor material included in the photoelectric conversion layer 22 include quinacridone, chlorinated boron subphthalocyanine, pentacene, benzothienobenzothiophene, fullerene, and derivatives thereof. The photoelectric conversion layer 22 includes a combination of two or more of the above-described organic semiconductor materials. The above-described organic semiconductor materials each serve as a p-type semiconductor or an n-type semiconductor depending on a combination thereof.

It is to be noted that the organic semiconductor materials included in the photoelectric conversion layer 22 are not particularly limited. Other than the above-described organic semiconductor materials, for example, one kind of naphthalene, anthracene, phenanthrene, tetracene, pyrene, perylene, fluoranthene, and derivatives thereof is preferably used. Alternatively, a polymer or a derivative of phenylenevinylene, fluorene, carbazole, indole, pyrene, pyrrole, picoline, thiophene, acetylene, diacetylene, and the like may be used. In addition, metal complex dyes, cyanine-based dyes, merocyanine-based dyes, phenylxanthene-based dyes, triphenylmethane-based dyes, rhodacyanine-based dyes, xanthene-based dyes, macrocyclic aza-annulene-based dyes, azulene-based dyes, naphthoquinone, anthraquinone-based dyes, chain compounds obtained by condensation between condensed polycyclic aromatic groups, such as anthracene and pyrene, and aromatic or hetero ring compounds, two nitrogen-containing heterocyclic rings, such as quinolone, benzothiazole, and benzooxazole, having a squarylium group and a croconic methine group as bonding chains, and cyanine analogue dyes bonded by a squarylium group and a croconic methine group may be used. Note that as the above-described metal complex dyes, dithiol metal complex-based dyes, metal phthalocyanine dyes, metal porphyrin dyes, and ruthenium complex dyes are preferable but not limiting. The photoelectric conversion layer 22 has, for example, a thickness of 50 nm to 500 nm.

Any other layer, for example, a buffer layer may be provided between the photoelectric conversion layer 22 and the lower electrode 21 and between the photoelectric conversion layer 22 and the upper electrode 23. In addition, for example, an undercoat film, a hole transport layer, an electron blocking film, the photoelectric conversion layer 22, a hole blocking film, a buffer film, an electron transport layer, a work function adjustment film, and the like may be stacked in order from a side on which the lower electrode 21 is located.

The upper electrode 23 includes a conductive film having light transparency, as with the lower electrode 21. In the imaging device 1 using the imaging element 10 as one pixel, the upper electrode 23 may be separately provided for each of the pixels, or may be formed as a common electrode for the respective pixels. The upper electrode 23 has, for example, a thickness of 10 nm to 200 nm.

The fixed electric charge layer 24 may be a film having positive fixed electric charges or a film having negative fixed electric charges. Materials having the negative fixed electric charges include hafnium oxide, aluminum oxide, zirconium oxide, tantalum oxide, titanium oxide, etc. As materials other than the above-described materials, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, an aluminum oxynitride film, etc. are usable.

The fixed electric charge layer 24 may have a configuration in which two or more of films are stacked. This makes it possible to further enhance a function as a hole accumulation layer in a case of the film having fixed negative electric charges, for example.

Examples of the material of the dielectric layer 25 include, but not specifically limited to, a silicon oxide film, TEOS, a silicon nitride film, and a silicon oxynitride film.

The interlayer insulating layer 26 includes, for example, a single-layer film including one of materials such as silicon oxide, silicon nitride, and silicon oxynitride (SiON) or a laminated film including two or more of these materials.

The protective layer 27 includes a material having light transparency, and includes, for example, a single-layer film including one of materials such as silicon oxide, silicon nitride, and silicon oxynitride or a laminated film including two or more of these materials. The protective layer 19 has, for example, a thickness of 100 nm to 30000 nm.

The semiconductor substrate 30 includes, for example, an n-type silicon (Si) substrate, and includes a p-well 31 in a predetermined region. The vertical transistor Tr1, the transfer transistor Tr2, the amplifier transistor AMP, the reset transistor RST, etc. that are described above are provided in the p-well 31 on the second surface 30B. Moreover, a peripheral circuit (not illustrated) including a logic circuit, etc. is provided in a peripheral portion of the semiconductor substrate 30.

Each of the inorganic photoelectric converters 32B and 32R has a p-n junction in a predetermined region of the semiconductor substrate 30. The inorganic photoelectric converters 32B and 32R enable dispersion of light in a longitudinal direction with use of a difference in wavelength of absorbed light depending on a depth of light incidence in the silicon substrate. The inorganic photoelectric converter 32B selectively detects blue light to accumulate signal electric charges corresponding to blue, and is disposed at a depth at which efficient photoelectric conversion of blue light is possible. The inorganic photoelectric converter 32R selectively detects red light to accumulate signal electric charges corresponding to red, and is disposed at a depth at which efficient photoelectric conversion of red light is possible. It is to be noted that blue (B) is, for example, a color corresponding to a wavelength range of 450 nm to 495 nm, and red (R) is, for example, a color corresponding to a wavelength range of 620 nm to 750 nm. It is only necessary to allow each of the inorganic photoelectric converters 32B and 32R to detect light in a portion or the entirety of each of the wavelength ranges.

The inorganic photoelectric converter 32B includes, for example, a p+ region serving as a hole accumulation layer, and an n region serving as an electron accumulation layer. The inorganic photoelectric converter 32R includes, for example, a p+ region serving as a hole accumulation layer and an n region serving as an electron accumulation layer (has a p-n-p stacked configuration). The n region of the inorganic photoelectric converter 32B is coupled to the vertical transistor Tr1. The p+ region of the inorganic photoelectric converter 32B is bent along the vertical transistor Tr1, and is linked to the p+ region of the inorganic photoelectric converter 32R.

The vertical transistor Tr1 is a transfer transistor that transfers, to the floating diffusion FD1, signal electric charges (electrons in the present embodiment) corresponding to blue generated and accumulated in the inorganic photoelectric converter 32B. The inorganic photoelectric converter 32B is formed at a deep position from the second surface 30B of the semiconductor substrate 30; therefore, the transfer transistor of the inorganic photoelectric converter 32B preferably includes the vertical transistor Tr1.

The transfer transistor Tr2 transfers, to the floating diffusion FD2, signal electric charges (electrons in the present embodiment) corresponding to red generated and accumulated in the inorganic photoelectric converter 32R, and includes, for example, a MOS transistor.

The amplifier transistor AMP is a modulator that modulates an amount of electric charges generated in the organic photoelectric converter 20 into voltage, and includes, for example, a MOS transistor.

The reset transistor RST resets electric charges transferred from the organic photoelectric converter 20 to the floating diffusion FD3, and includes, for example, a MOS transistor.

The first lower contact 35, the second lower contact 45, the third lower contact 46, and the upper contact 36 include, for example, a doped silicon material such as PDAS (Phosphorus Doped Amorphous Silicon), or a metal material such as aluminum (Al), tungsten (W), titanium (Ti), cobalt (Co), hafnium (HD, and tantalum (Ta).

(1-2. Method of Manufacturing Imaging Element)

The imaging element 10 according to the present embodiment is manufacturable as follows, for example.

FIGS. 6 to 9 illustrate a method of manufacturing the imaging element 10 in process order. First, as illustrated in FIG. 6, for example, the p-well 31 is formed as a well of a first conductive type in the semiconductor substrate 30, and the inorganic photoelectric converters 32B and 32R of a second conductive type (for example, n-type) are formed in the p-well 31. A p+ region is formed in proximity to the first surface 30A of the semiconductor substrate 30.

Moreover, as also illustrated in FIG. 6, an impurity region (a p+ region) penetrating from the first surface 30A to the second surface 30B of the semiconductor substrate 30 is formed in a region where the through electrode 34 and the separation groove 50 are to be formed. Further, a high-concentration impurity region (a p++ region) is formed in a region where the top end section and the bottom end section of the through electrode 34 are to be formed.

As also illustrated in FIG. 6, on the second surface 30B of the semiconductor substrate 30, n+ regions serving as the floating diffusions FD1 to FD3 are formed, and thereafter, the gate insulating layer 33 and the gate wiring layer 37 including respective gates of the vertical transistor Tr1, the transfer transistor Tr2, the amplifier transistor AMP, and the reset transistor RST are formed. Thus, the vertical transistor Tr1, the transfer transistor Tr2, the amplifier transistor AMP, and the reset transistor RST are formed. Moreover, the multilayer wiring line 40 including the first lower contact 35, the second lower contact 45, the third lower contact 46, and the multilayer wiring line 40 are formed on the second surface 30B of the semiconductor substrate 30. The multilayer wiring line 40 includes the wiring layers 41 to 43 that include the connection unit 41A, and the insulating layer 44.

As a base of the semiconductor substrate 30, for example, an SOI (Silicon on Insulator) substrate in which the semiconductor substrate 30, an embedding oxide film (not illustrated), and a holding substrate (not illustrated) are stacked is used. The embedding oxide film and the holding substrate are not illustrated in FIG. 6, but are bonded to the first surface 30A of the semiconductor substrate 30. Annealing treatment is performed after ion implantation.

Next, a supporting substrate (not illustrated), another semiconductor base, or the like is bonded on the side on which the second surface 30B is located of the semiconductor substrate 30 (on a side on which the multilayer wiring line 40 is located), and is flipped from top to bottom. Subsequently, the semiconductor substrate 30 is separated from the embedding oxide film and holding substrate of the SOI substrate to expose the first surface 30A of the semiconductor substrate 30. It is possible to perform the above processes by technologies used in a typical CMOS process such as ion implantation and CVD (Chemical Vapor Deposition).

Next, as illustrated in FIG. 7, the semiconductor substrate 30 is processed by, for example, dry etching from the side on which the first surface 30A is located to form the separation groove 50 having a circular shape or a ring shape. The depth of the separation groove 50 preferably penetrates from the first surface 30A to the second surface 30B of the semiconductor substrate 30 to reach the gate insulating layer 33, as indicated by an arrow D50A of FIG. 7. Moreover, in order to further enhance an insulating effect in the bottom surface 53 of the separation groove 50, the separation groove 50 preferably penetrates through the semiconductor substrate 30 and the gate insulating layer 33 to reach the insulating layer 44 of the multilayer wiring line 40, as indicated by an arrow D50B of FIG. 7. FIG. 7 illustrates a case where the separation groove 50 penetrates through the semiconductor substrate 30 and the gate insulating layer 33.

Next, for example, the negative fixed electric charge layer 24 is formed on the outer surface 51, the inner surface 52, and the bottom surface 53 of the separation groove 50 and the first surface 30A of the semiconductor substrate 30, as illustrated in FIG. 8. As the negative fixed electric charge layer 24, two or more of films may be stacked. This makes it possible to further enhance a function as a hole accumulation layer. After the negative fixed electric charge layer 24 is formed, the dielectric layer 25 including the outer dielectric layer 25A and the inner dielectric layer 25B is formed. At this time, a film thickness and film formation conditions of the dielectric layer 25 are appropriately adjusted to form the cavity 54 between the outer dielectric layer 25A and the inner dielectric layer 25B in the separation groove 50.

Subsequently, as illustrated in FIG. 9, the interlayer insulating layer 26 and the upper contact 36 are formed, and the upper contact 36 is coupled to a top end of the through electrode 34. Thereafter, the lower electrode 21, the photoelectric conversion layer 22, the upper electrode 23, and the protective layer 27 are formed on the interlayer insulating layer 26. At this time, the photoelectric conversion layer 22 is formed through forming a film of the above-described organic semiconductor materials on the lower electrode 21 with use of a coating method and thereafter performing one or both of heating treatment and pressurization treatment. This makes it possible to control molecular orientation of the organic semiconductor materials included in the photoelectric conversion layer 22 and increase a ratio of the p-n junction surface having a high exciton charge separation rate of $1\times10^{10}$ s$^{-1}$ or more. Lastly, an optical member such as a planarization layer and an on-chip lens (not illustrated) are provided. Thus, the imaging element 10 illustrated in FIG. 1 is completed.

In the imaging element 10, light enters the organic photoelectric converter 20 via the on-chip lens (not illustrated), and thereafter the light passes through the organic photoelectric converter 20, the inorganic photoelectric converters 32B and 32R in this order. Each of green light, blue light, and red light is subjected to photoelectric conversion in the course of passing. Hereinafter, description is given of an operation of obtaining a signal of each color.

(Obtaining of Green Signal by Organic Photoelectric Converter 20)

First, green light of light having entered the imaging element 10 is selectively detected (absorbed) by the organic photoelectric converter 20 to be subjected to photoelectric conversion.

The organic photoelectric converter 20 is coupled to the gate Gamp of the amplifier transistor AMP and the floating diffusion FD3 via the through electrode 34. Accordingly, electrons of electron-hole pairs generated in the organic photoelectric converter 20 are extracted from the side on which the lower electrode 21 is located, and are transferred to the side on which the second surface 30B is located of the semiconductor substrate 30 via the through electrode 34 to be accumulated in the floating diffusion FD3. Simultaneously with this, the amount of electric charges generated in the organic photoelectric converter 20 is modulated into voltage by the amplifier transistor AMP.

Moreover, the reset gate Grst of the reset transistor RST is disposed adjacent to the floating diffusion FD3. Accordingly, the electric charges accumulated in the floating diffusion FD3 are reset by the reset transistor RST.

Here, the organic photoelectric converter 20 is coupled to not only the amplifier transistor AMP but also the floating diffusion FD3 via the through electrode 34, which makes it possible to easily reset the electric charges accumulated in the floating diffusion FD3 by the reset transistor RST.

In contrast, in a case where the through electrode 34 and the floating diffusion FD3 are not coupled to each other, it is difficult to reset the electric charges accumulated in the floating diffusion FD3, which causes the electric charges to be drawn to a side on which the upper electrode 23 is located by application of a large voltage. Therefore, the photoelectric conversion layer 22 may be damaged. Moreover, a configuration that enables resetting for a short time causes an increase in dark time noise, thereby resulting in a trade-off; therefore, this configuration is difficult.

(Obtaining of Blue Signal and Red Signal by Inorganic Photoelectric Converters 32B and 32R)

Next, blue light and red light of light having passed through the organic photoelectric converter 20 are respectively absorbed in order by the inorganic photoelectric converter 32B and the inorganic photoelectric converter 32R to be subjected to photoelectric conversion. In the inorganic photoelectric converter 32B, electrons corresponding to the blue light having entered the inorganic photoelectric converter 32B are accumulated in the n region of the inorganic photoelectric converter 32B, and the accumulated electrons are transferred to the floating diffusion FD1 by the vertical transistor Tr1. Likewise, in the inorganic photoelectric converter 32R, electrons corresponding to the red light having entered the inorganic photoelectric converter 32R are accumulated in the n region of the inorganic photoelectric converter 32R, and the accumulated electrons are transferred to the floating diffusion FD2 by the transfer transistor Tr2.

(1-3. Workings and Effects)

In solid-state imaging devices such as CCD image sensors and CMOS image sensors, a pixel size has been reduced. Accordingly, the number of photons entering a unit pixel is reduced to deteriorate sensitivity and decrease an S/N ratio. Moreover, in a case where a color filter including primary color filters of red, green, and blue that are two-dimensionally arranged is used for colorization, for example, in a red pixel, sensitivity is deteriorated by absorption of light (green light and blue light) other than red light by the color filter. Further, interpolation processing is performed between pixels upon generation of respective color signals, which causes so-called false color. Therefore, as described above, an imaging element that obtains signals of three colors in one pixel to suppress deterioration in sensitivity has been developed.

However, in recent years, the solid-state imaging device has been further downsized, and a further improvement in sensitivity is demanded. Sensitivity of the solid-state imaging device is significantly influenced by exciton charge separation efficiency (an exciton charge separation rate) in the bulk-hetero structure. FIG. 10 illustrates a cross-sectional configuration of an organic photoelectric converter 200 that includes a photoelectric conversion layer 213 having a bulk-hetero structure. A p-type semiconductor layer 213a and an n-type semiconductor layer 213b are mixed in the photoelectric conversion layer 213. Light (L) having entered the photoelectric conversion layer 213 excites electrons in organic molecules included in the photoelectric conversion layer 213 to generate singlet excitons. The singlet excitons are diffused to reach a boundary between the p-type semiconductor layer 213a and the n-type semiconductor layer 213b, that is, the p-n junction surface, and thereafter are subjected to electric charge separation into holes and electrons by an inner electric field generated in the p-n junction surface. The holes of generated electric charges are transported to a lower electrode 211 via a buffer layer 212 by a p-type semiconductor, and the electrons are transported to an upper electrode 215 via a buffer layer 214 by an n-type semiconductor.

In order to improve sensitivity of the solid-state imaging device, it is important to improve the exciton charge separation rate to enhance photoelectric conversion efficiency. In general, singlet excitons of organic molecules are deactivated in 1 ns to 1 μs to be returned to a ground state. Accordingly, in order to enhance photoelectric conversion efficiency, it is preferable to perform exciton charge separation in, for example, 0.1 ns or less that is sufficiently shorter than an exciton lifetime. Accordingly, the exciton charge separation rate in the p-n junction surface is preferably $1 \times 10^{10}$ $s^{-1}$ or more.

It is presumed that the exciton charge separation rate is related to molecular orientation in the p-n junction surface. However, it is difficult to experimentally know molecular orientation in the p-n junction surface; therefore, research mainly using theoretical simulations has been advanced. In typical theoretical research, evaluation of the exciton charge separation rate is performed with use of a dimer including p-type molecules and n-type molecules. However, in a dimer calculation, an influence of peripheral molecules is not considered; therefore, the p-n junction surface has a stable structure that is different from that of an actual p-n junction surface, and it is difficult to examine actually existing various molecular orientations. Moreover, external reorganization energy and free energy by peripheral molecules are not considered, thereby resulting in low calculation accuracy of the exciton charge separation rate. Accordingly, a relationship between molecular orientation in the p-n junction surface and the exciton charge separation rate is not proved, and a method of evaluating the exciton charge separation rate in a realistic p-n interface structure at high accuracy is desired.

Hence, in the present embodiment, a relationship between molecular orientation in the p-n junction surface and the exciton charge separation rate in the p-n interface structure including polymolecules is evaluated through performing the following simulation. First, for example, quinacridone (QD) and chlorinated boron subphthalocyanine (SubPc-Cl) are respectively adopted as the p-type semiconductor and the n-type semiconductor, and a QD crystal and a SubPc-Cl crystal are used as initial structures. In the QD crystal and the SubPc-Cl crystal, orientation of respective molecules is controlled, and each of the QD crystal and the SubPc-Cl crystal has crystal planes represented by a (001) plane, a (010) plane, and a (100) plane. It is to be noted that the SubPc-Cl crystal has two kinds of (001) planes. FIG. 11 illustrates a molecular structure of SubPc-Cl by a ball-and-stick model. The SubPc-Cl molecule has a structure in which, for example, a Cl atom protrudes in a Y-axis direction from a B atom as a base point and a macrocyclic structure including an N atom is bent in a direction opposite to a direction where the Cl atom protrudes, as illustrated in FIG. 11. Here, a plane on which a protruding side (a side on which the Cl atom is located) of the bent SubPc-Cl molecule is referred to as a (001)A plane, and a plane on which a recessed side (a side on which the macrocyclic structure is located) is exposed is referred to as a (001)B plane. In the present embodiment, the exciton charge separation rates in twelve kinds of p-n junction surfaces formed by combinations of the (001) plane, the (010) plane, and (100) plane of the QD crystal and the (100) plane, the (010) plane, the (001)A plane, and the (001)B plane of the SubPc-Cl crystal are examined. A method of forming the p-n junction surface by simulation is described with reference to FIGS. 12A and 12B.

FIG. 12A schematically illustrates a theoretical interface structure (a p-n junction surface) formed by the (100) plane of the QD crystal and the (001)B plane of the SubPc-Cl crystal. It is to be noted that a shape of each of the Sub-Pc-Cl molecules illustrated in FIGS. 12A and 12B schematically represents a bent macrocyclic structure portion. FIG. 12B schematically illustrates an interface structure obtained through performing structure optimization calculation on the theoretical interface structure illustrated in FIG. 12A. The structure optimization calculation uses an OM/MM method in which a center dimer (in a ball-and-stick representation) of which the exciton charge separation rate is to be determined is calculated by quantum mechanics and peripheral molecules (in a line representation) are calculated by molecular mechanics. The interface structure obtained by the structure optimization calculation causes disorder of molecular orientation around the interface, and is a more realistic energy stable interface structure (energy stable structure), as illustrated in FIG. 12B. This makes it possible to evaluate a relationship between molecular orientation in the p-n junction surface and the exciton charge separation rate in consideration of an influence of peripheral molecules. It is difficult to evaluate such a relationship with use of only the above-described dimer.

In the present embodiment, twelve kinds of interface structures of QD and SubPc-Cl were formed by the above-described method as examples, and exciton charge separation rates in the p-n junction surfaces of these interface structures were determined on the basis of the Marcus theory. In the Marcus theory, an electric charge transfer rate between an initial state (a state a) and a final state (a state b) is represented by the following expression (1).

[Math. 1]

$$\omega_{ab} = \frac{H_{ab}^2}{\hbar} \left( \frac{\pi}{\lambda k_B T} \right)^{\frac{1}{2}} \exp\left( -\frac{(\Delta G + \lambda)^2}{4\lambda k_B T} \right) \qquad (1)$$

(where $H_{ab}$: transfer integration between two states (charge transfer integration), h: Plank constant, $\lambda$: relocation energy, $k_B$: Boltzmann constant, T: temperature, $\Delta G$: Gibbs free energy difference between two states)

$\Delta G$ and $\lambda$ between the respective excited states are calculated as follows. First, a singlet excited state is obtained from a first excited singlet state S1 to tenth excited singlet state S10, and structural optimization is carried out with respect to the respective excited states to obtain energy stable structures. Subsequently, vibrational calculation is carried out for the energy stable structures of the respective excited states to calculate free energy. As a result, $\Delta G$ and $\lambda$ between the respective excited states are calculated. $H_{ab}$ is determined by a generalized-Mulliken-Hush method.

The exciton charge separation rate in the p-n junction surface between QD and SubPc-Cl was determined with respect to both excitons generated in QD (QD excitons) and excitons generated in SubPc-Cl (SubPc-Cl excitons). Table 1 summarizes the exciton charge separation rates of the XD excitons and SubPc-Cl excitons in the twelve kinds of p-n junction between QD and SubPc-Cl. The exciton charge separation rates were calculated with use of the expression (1).

TABLE 1

| Interface | Exciton Charge Separation Rate [S⁻¹] | |
|---|---|---|
| (QD)-(CubPc-Cl) | QD excitons | SubPc-Cl excitons |
| (100)-(100) | $1.4 \times 10^4$ | <1 |
| (100)-(010) | <1 | <1 |
| (100)-(001)A | $5.2 \times 10^{12}$ | $4.6 \times 10^{12}$ |
| (100)-(001)B | $4.7 \times 10^{13}$ | $2.0 \times 10^{13}$ |
| (010)-(100) | $1.3 \times 10^6$ | <1 |
| (010)-(010) | $1.4 \times 10^8$ | $7.7 \times 10^{11}$ |
| (010)-(001)A | $4.7 \times 10^{10}$ | $6.6 \times 10^{13}$ |
| (010)-(001)B | $3.2 \times 10^{14}$ | $2.6 \times 10^{11}$ |
| (001)-(100) | <1 | <1 |
| (001)-(010) | <1 | <1 |
| (001)-(001)A | $4.9 \times 10^{12}$ | $4.4 \times 10^{12}$ |
| (001)-(001)B | $4.7 \times 10^6$ | $6.3 \times 10^{11}$ |

As can be seen from Table 1, the exciton charge separation rate significantly differs depending on combinations of the crystal planes of QD and SubPc-Cl forming the interface structure (p-n junction surface), but an interface structures having a high exciton charge separation rate are present. In particular, it was found that an exciton charge separation rate of $1 \times 10^{10}$ s⁻¹ or more was obtained in combinations of the (100) plane-the (001)A plane, the (100) plane-the (001)B plane, the (010) plane-the (010) plane, the (010) plane-the (001)A plane, the (010) plane-the (001)B plane, the (001) plane-the (001)A plane, and the (001) plane-the (001)B as the combination of the crystal plane of QD and the crystal plane of Sub-Pc-Cl forming the p-n junction surface. In a case where molecular orientation is not controlled, as the p-n junction surface twelve combinations in Table 12 are randomly present; therefore, a ratio of the p-n junction surface having a high exciton charge separation rate ($1 \times 10^{10}$ s⁻¹ or more) is about 7/12. In contrast, controlling molecular orientation of the p-type semiconductor and the n-type semiconductor included in the photoelectric conversion layer 22 makes it possible to enhance the ratio of the p-n junction surface having a high exciton charge separation rate in a layer close to 1.

As described above, in the present embodiment, the photoelectric conversion layer 22 is formed through forming a film of the organic semiconductor materials serving as the p-type semiconductor and the n-type semiconductor with use of, for example, a coating method and thereafter performing one or both of heating treatment and pressurization treatment. Accordingly, the molecular orientation of the organic semiconductor materials in the photoelectric conversion layer 22 is controlled to enhance the ratio of the p-n junction surface having a high exciton charge separation rate of $1 \times 10^{10}$ $s^{-1}$ or more. This makes it possible to improve photoelectric conversion efficiency in the photoelectric conversion layer 22 and provide an imaging element having high sensitivity.

2. Application Examples

Application Example 1

FIG. 13 illustrates an entire configuration of an imaging device (an imaging device 1) using the imaging element 10 described in the foregoing embodiment for each pixel. The imaging device 1 is a CMOS image sensor, and includes a pixel section 1a as an imaging region and a peripheral circuit section 130 in a peripheral region of the pixel section 1a on a semiconductor substrate 30. The peripheral circuit section 130 includes, for example, a row scanner 131, a horizontal selector 133, a column scanner 134, and a system controller 132.

The pixel section 1a includes, for example, a plurality of unit pixels P (each corresponding to the imaging element 10) that are two-dimensionally arranged in rows and columns. The unit pixels P are wired with pixel driving lines Lread (specifically, row selection lines and reset control lines) for respective pixel rows, and are wired with vertical signal lines Lsig for respective pixel columns. The pixel driving lines Lread transmit drive signals for signal reading from the pixels. The pixel driving lines Lread each have one end coupled to a corresponding one of output terminals, corresponding to the respective rows, of the row scanner 131.

The row scanner 131 includes a shift register, an address decoder, etc., and is, for example, a pixel driver that drives the respective pixels P of the pixel section 1a on a row basis. Signals outputted from the respective pixels P of a pixel row selected and scanned by the row scanner 131 are supplied to the horizontal selector 133 through the respective vertical signal lines Lsig. The horizontal selector 133 includes, for example, an amplifier, a horizontal selection switch, etc. that are provided for each of the vertical signal lines Lsig.

The horizontal selector 133 includes a shift register, an address decoder, etc., and drives the respective horizontal selection switches of the horizontal selector 133 in order while sequentially performing scanning of those horizontal selection switches. Such selection and scanning performed by the horizontal selector 133 allow the signals of the respective pixels transmitted through the respective vertical signal lines Lsig to be sequentially outputted to a horizontal signal line 135. The thus-outputted signals are transmitted to outside of the semiconductor substrate 30 through the horizontal signal line 135.

A circuit portion including the row scanner 131, the horizontal selector 133, the column scanner 134, and the horizontal signal line 135 may be provided directly on the semiconductor substrate 30, or may be disposed in an external control IC. Alternatively, the circuit portion may be provided in any other substrate coupled by means of a cable or the like.

The system controller 132 receives a clock supplied from the outside of the semiconductor substrate 30, data on instructions of operation modes, and the like, and outputs data such as internal information of the imaging device 1. Furthermore, the system controller 132 includes a timing generator that generates various timing signals, and performs drive control of peripheral circuits such as the row scanner 131, the horizontal selector 133, and the horizontal selector 133 on the basis of the various timing signals generated by the timing generator.

Application Example 2

The foregoing imaging device 1 is applicable to various kinds of electronic apparatuses having imaging functions. Examples of the electronic apparatuses include camera systems such as digital still cameras and video cameras, mobile phones having imaging functions, and the like. FIG. 14 illustrates, for purpose of an example, a schematic configuration of an electronic apparatus 2 (a camera). The electronic apparatus 2 is, for example, a video camera that allows for shooting of a still image or a moving image. The electronic apparatus 2 includes the imaging device 1, an optical system (an optical lens) 310, a shutter device 311, a driver 313, and a signal processor 312. The driver 313 drives the imaging device 1 and the shutter device 311.

The optical system 310 guides image light (incident light) from an object toward the pixel section 1a of the imaging device 1. The optical system 310 may include a plurality of optical lenses. The shutter device 311 controls a period in which the imaging device 1 is irradiated with the light and a period in which the light is blocked. The driver 313 controls a transfer operation of the imaging device 1 and a shutter operation of the shutter device 311. The signal processor 312 performs various signal processes on signals outputted from the imaging device 1. A picture signal Dout having been subjected to the signal processes is stored in a storage medium such as a memory, or is outputted to a monitor or the like.

Although the description has been given by referring to the embodiment and the application examples, the contents of the present disclosure are not limited to the foregoing embodiment, etc., and may be modified in a variety of ways. For example, in the foregoing embodiment, a configuration in which the organic photoelectric converter 20 that detects green light and the inorganic photoelectric converters 32B and 32R that respectively detect blue light and red light are stacked is adopted as the imaging element (the imaging device); however, the contents of the present disclosure are not limited to such a configuration. More specifically, the organic photoelectric converter may detect red light or blue light, and the inorganic photoelectric converter may detect green light.

Moreover, the numbers of organic photoelectric converters and inorganic photoelectric converters and a ratio thereof are not limited. Two or more organic photoelectric converters may be provided, and color signals of a plurality of colors may be obtained only by the organic photoelectric converters. Further, the present disclosure is not limited to the configuration in which the organic photoelectric converter and the inorganic photoelectric converter are stacked in the longitudinal direction, and the organic photoelectric converter and the inorganic photoelectric converter may be arranged side by side along a substrate surface.

Furthermore, the foregoing embodiment has exemplified the configuration of the imaging device of a back-side illumination type; however, the contents of the present disclosure are applicable to an imaging device of a front-side illumination type. Moreover, it may not be necessary for the imaging device (the imaging element) of the present disclosure to include all components described in the foregoing embodiment, or the imaging device (the imaging element) of the present disclosure may include any other layer.

Further, the technology achieved by the present disclosure is applicable not only to the imaging element but also to a solar battery, for example.

It is to be noted that the effects described in the description are merely illustrative and non-limiting, and other effects may be included.

It is to be noted that the present disclosure may have the following configurations.

(1)
An imaging element, including:
a first electrode and a second electrode facing each other; and
a photoelectric conversion layer including a p-type semiconductor and an n-type semiconductor, and provided between the first electrode and the second electrode, in which
the photoelectric conversion layer has an exciton charge separation rate of $1\times10^{10}$ s$^{-1}$ to $1\times10^{16}$ s$^{-1}$ both inclusive in a p-n junction surface formed by the p-type semiconductor and the n-type semiconductor.

(2)
The imaging element according to (1), in which one of the p-type semiconductor and the n-type semiconductor is quinacridone or a quinacridone derivative.

(3)
The imaging element according to (1) or (2), in which one of the p-type semiconductor and the n-type semiconductor is chlorinated boron subphthalocyanine or a chlorinated boron subphthalocyanine derivative.

(4)
The imaging element according to (1) or (2), in which one of the p-type semiconductor and the n-type semiconductor is pentacene or a pentacene derivative.

(5)
The imaging element according to (1) or (2), in which one of the p-type semiconductor and the n-type semiconductor is benzothienobenzothiophene or a benzothienobenzothiophene derivative.

(6)
The imaging element according to (1) or (2), in which one of the p-type semiconductor and the n-type semiconductor is fullerene or a fullerene derivative.

(7)
The imaging element according to any one of (1) to (6), in which the photoelectric conversion layer includes two or more of quinacridone, a quinacridone derivative, chlorinated boron subphthalocyanine, a chlorinated boron subphthalocyanine derivative, pentacene, a pentacene derivative, benzothienobenzothiophene, a benzothienobenzothiophene derivative, fullerene, and a fullerene derivative.

(8)
The imaging element according to any one of (1) to (3), in which
the photoelectric conversion layer includes quinacridone or a quinacridone derivative as the p-type semiconductor and chlorinated boron subphthalocyanine or a chlorinated boron subphthalocyanine derivative as the n-type semiconductor, and
the p-n junction surface includes, as a combination of a crystal plane of the quinacridone or the quinacridone derivative and a crystal plane of the chlorinated boron subphthalocyanine or the chlorinated boron subphthalocyanine derivative, one of a (100) plane-a (001)A plane, the (100) plane-a (001)B plane, a (010) plane-a (010) plane, the (010) plane-the (001)A plane, the (010) plane-the (001)B plane, a (001) plane-the (001)A plane, and the (001) plane-the (001)B plane.

(9)
The imaging element according to any one of (1) to (8), in which an organic photoelectric converter including one or a plurality of the photoelectric conversion layers, and one or a plurality of inorganic photoelectric converters are stacked, the inorganic photoelectric converters performing photoelectric conversion in a different wavelength range from the organic photoelectric converter.

(10)
The imaging element according to (9), in which
the inorganic photoelectric converter is formed to be embedded in a semiconductor substrate, and
the organic photoelectric converter is formed on a side on which a first surface is located of the semiconductor substrate.

(11)
The imaging element according to (10), in which a multilayer wiring layer is formed on a side on which a second surface is located of the semiconductor substrate.

(12)
The imaging element according to (10) or (11), in which
the organic photoelectric converter performs photoelectric conversion of green light, and
an inorganic photoelectric converter that performs photoelectric conversion of blue light and an inorganic photoelectric converter that performs photoelectric conversion of red light are stacked inside the semiconductor substrate.

(13)
A method of manufacturing an imaging element, the method including:
forming a first electrode;
forming a photoelectric conversion layer including a p-type semiconductor and an n-type semiconductor on the first electrode; and
forming a second electrode on the photoelectric conversion layer, in which
the photoelectric conversion layer has an exciton charge separation rate of $1\times10^{10}$ s$^{-1}$ to $1\times10^{16}$ s$^{-1}$ both inclusive in a p-n junction surface formed by the p-type semiconductor and the n-type semiconductor.

(14)
The method of manufacturing the imaging element according to (13), in which heating treatment is performed after forming the photoelectric conversion layer.

(15)
The method of manufacturing the imaging element according to (13), in which pressurization treatment is performed after forming the photoelectric conversion layer.

(16)
The method of manufacturing the imaging element according to (13), in which heating treatment and pressurization treatment are performed after forming the photoelectric conversion layer.

(17)

An imaging device provided with a plurality of pixels each including one or a plurality of imaging elements, each of the imaging elements including:
  a first electrode and a second electrode facing each other; and
  a photoelectric conversion layer including a p-type semiconductor and an n-type semiconductor, and provided between the first electrode and the second electrode, in which
  the photoelectric conversion layer has an exciton charge separation rate of $1\times10^{10}$ s$^{-1}$ to $1\times10^{16}$ s$^{-1}$ both inclusive in a p-n junction surface formed by the p-type semiconductor and the n-type semiconductor.

This application claims the benefit of Japanese Priority Patent Application No. 2016-111096 filed with the Japan Patent Office on Jun. 2, 2016, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. An imaging element, comprising:
   a first electrode;
   a second electrode that faces the first electrode; and
   a photoelectric conversion layer between the first electrode and the second electrode, wherein
     the photoelectric conversion layer comprises a p-type semiconductor, an n-type semiconductor, and a p-n junction surface between the p-type semiconductor and the n-type semiconductor,
     the p-type semiconductor and the n-type semiconductor have controlled molecular orientations, and
     the p-n junction surface includes a specific combination of a first crystal plane of the p-type semiconductor and a second crystal plane of the n-type semiconductor based on the controlled molecular orientations, such that the photoelectric conversion layer has an exciton charge separation rate of $1\times10^{10}$ s$^{-1}$ to $1\times10^{16}$ s$^{-1}$, both inclusive in the p-n junction surface.

2. The imaging element according to claim 1, wherein one of the p-type semiconductor or the n-type semiconductor is one of quinacridone or a quinacridone derivative.

3. The imaging element according to claim 1, wherein one of the p-type semiconductor or the n-type semiconductor is one of chlorinated boron subphthalocyanine or a chlorinated boron subphthalocyanine derivative.

4. The imaging element according to claim 1, wherein one of the p-type semiconductor or the n-type semiconductor is one of pentacene or a pentacene derivative.

5. The imaging element according to claim 1, wherein one of the p-type semiconductor or the n-type semiconductor is one of benzothienobenzothiophene or a benzothienobenzothiophene derivative.

6. The imaging element according to claim 1, wherein one of the p-type semiconductor or the n-type semiconductor is one of fullerene or a fullerene derivative.

7. The imaging element according to claim 1, wherein the photoelectric conversion layer includes at least two of quinacridone, a quinacridone derivative, chlorinated boron subphthalocyanine, a chlorinated boron subphthalocyanine derivative, pentacene, a pentacene derivative, benzothienobenzothiophene, a benzothienobenzothiophene derivative, fullerene, and a fullerene derivative.

8. The imaging element according to claim 1, wherein
   the photoelectric conversion layer includes one of quinacridone or a quinacridone derivative as the p-type semiconductor, and one of chlorinated boron subphthalocyanine or a chlorinated boron subphthalocyanine derivative as the n-type semiconductor, and
   the p-n junction surface includes a combination of a crystal plane of the quinacridone or the quinacridone derivative and a crystal plane of the chlorinated boron subphthalocyanine or the chlorinated boron subphthalocyanine derivative.

9. The imaging element according to claim 1, further comprising:
   an organic photoelectric converter that comprises at least one photoelectric conversion layer including the photoelectric conversion layer, and
   at least one inorganic photoelectric converter, wherein
   the organic photoelectric converter and the at least one inorganic photoelectric converter are stacked,
   the at least one inorganic photoelectric converter is configured to:
     execute photoelectric conversion in a different wavelength range from the organic photoelectric converter.

10. The imaging element according to claim 9, wherein
    the at least one inorganic photoelectric converter is embedded in a semiconductor substrate, and
    the organic photoelectric converter is on a side on which a first surface of the semiconductor substrate is located.

11. The imaging element according to claim 10, further comprising a multilayer wiring layer on a side on which a second surface of the semiconductor substrate is located.

12. The imaging element according to claim 10, wherein
    the organic photoelectric converter is configured to execute photoelectric conversion of green light,
    a first inorganic photoelectric converter is configured to execute photoelectric conversion of blue light, and
    a second inorganic photoelectric converter is configured to execute photoelectric conversion of red light,
    the organic photoelectric converter, the first inorganic photoelectric converter, and the second inorganic photoelectric converter are stacked inside the semiconductor substrate.

13. The imaging element according to claim 1, wherein the specific combination of the first crystal plane and the second crystal plane comprises one of a (100) plane-a (001)A plane, the (100) plane-a (001)B plane, a (010) plane-a (010) plane, the (010) plane-the (001)A plane, the (010) plane-the (001)B plane, a (001) plane-the (001)A plane, or the (001) plane-the (001)B plane.

14. A method of manufacturing an imaging element, the method comprising:
    forming a first electrode;
    forming a photoelectric conversion layer on the first electrode; and
    forming a second electrode on the photoelectric conversion layer, wherein
      the photoelectric conversion layer comprises a p-type semiconductor, an n-type semiconductor, and a p-n junction surface between the p-type semiconductor and the n-type semiconductor,
      the p-type semiconductor and the n-type semiconductor have controlled molecular orientations, and
      the p-n junction surface includes a specific combination of a first crystal plane of the p-type semiconductor and a second crystal plane of the n-type semiconductor based on the controlled molecular orientations, such that the photoelectric conversion layer has an exciton charge separation rate of $1\times10^{10}$ s$^{-1}$ to $1\times10^{16}$ s$^{-1}$, both inclusive in the p-n junction surface.

15. The method according to claim 14, further comprising subjecting the photoelectric conversion layer to a heat treatment.

16. The method of manufacturing the imaging element according to claim 14, further comprising subjecting the photoelectric conversion layer to a pressurization treatment.

17. The method of manufacturing the imaging element according to claim 14, further comprising subjecting the photoelectric conversion layer to a heat treatment and a pressurization treatment.

18. An imaging device, comprising:
a plurality of pixels, wherein each pixel of the plurality of pixels includes at least one imaging element, the at least one imaging element comprising:
a first electrode;
a second electrode that faces the first electrode; and
a photoelectric conversion layer between the first electrode and the second electrode, wherein
the photoelectric conversion layer comprises a p-type semiconductor, an n-type semiconductor, and a p-n junction surface between the p-type semiconductor and the n-type semiconductor,
the p-type semiconductor and the n-type semiconductor have controlled molecular orientations, and
the p-n junction surface includes a specific combination of a first crystal plane of the p-type semiconductor and a second crystal plane of the n-type semiconductor based on the controlled molecular orientations, such that the photoelectric conversion layer has an exciton charge separation rate of $1\times10^{10}$ s$^{-1}$ to $1\times10^{16}$ s$^{-1}$, both inclusive in the p-n junction surface.

* * * * *